(12) United States Patent
Chen et al.

(10) Patent No.: US 12,342,500 B2
(45) Date of Patent: Jun. 24, 2025

(54) SYSTEM AND METHOD FOR COOLING ELECTRONIC COMPUTING DEVICE WITH MULTIPLE-FUNCTION PUMP

(71) Applicant: Quanta Computer Inc., Taoyuan (TW)

(72) Inventors: Chao-Jung Chen, Taoyuan (TW); Kuo-Wei Lee, Taoyuan (TW); Huan-Shu Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 274 days.

(21) Appl. No.: 18/192,317

(22) Filed: Mar. 29, 2023

(65) Prior Publication Data

US 2024/0196565 A1 Jun. 13, 2024

Related U.S. Application Data

(60) Provisional application No. 63/386,972, filed on Dec. 12, 2022.

(51) Int. Cl.
*H05K 7/20* (2006.01)

(52) U.S. Cl.
CPC ..... *H05K 7/20272* (2013.01); *H05K 7/20772* (2013.01)

(58) Field of Classification Search
CPC ........... H05K 7/20781; H05K 7/20272; H05K 7/20772

See application file for complete search history.

(56) References Cited

U.S. PATENT DOCUMENTS

| | | | | |
|---|---|---|---|---|
| 7,717,470 | B1* | 5/2010 | Pluymers | F16L 55/07 285/13 |
| 11,711,908 | B1* | 7/2023 | Gao | H05K 7/20781 361/688 |
| 12,193,193 | B2* | 1/2025 | Varela Benitez | H05K 7/20781 |
| 2003/0197368 | A1* | 10/2003 | Reifschneider | F16L 39/04 285/121.6 |
| 2005/0247433 | A1* | 11/2005 | Corrado | G06F 1/20 165/80.4 |
| 2016/0044833 | A1* | 2/2016 | Krishnan | H05K 7/20818 165/80.4 |
| 2016/0242326 | A1* | 8/2016 | Edwards | F04D 25/16 |
| 2020/0163251 | A1* | 5/2020 | Chopra | G06F 1/20 |
| 2022/0346271 | A1* | 10/2022 | Chen | H05K 7/20763 |
| 2023/0066006 | A1* | 3/2023 | Gao | H05K 7/20781 |
| 2023/0164952 | A1* | 5/2023 | Ortega Gutierrez | H05K 7/20318 361/699 |

(Continued)

*Primary Examiner* — Paul Alvare
(74) *Attorney, Agent, or Firm* — NIXON PEABODY LLP

(57) ABSTRACT

A cooling distribution system cools an electronic computing device and includes a plurality of hot-swappable pump modules mounted within a distribution unit chassis and configured to circulate a coolant along a main cooling path. A coolant inlet manifold is mounted within the chassis and is fluidly coupled to the pump modules to allow entry of the coolant into the main cooling path. A coolant collection pan collects leaked coolant from the coolant circulating along the main cooling path. A recycle pump is fluidly coupled to form a recycle cooling path between the collection pan and the inlet manifold, and is configured to pump the leaked coolant from the collection pan back to the inlet manifold for recirculating the leaked coolant into the main cooling path.

20 Claims, 4 Drawing Sheets

(56) References Cited

U.S. PATENT DOCUMENTS

2023/0262928 A1* 8/2023 Dean .................. H05K 7/20272
165/80.4
2023/0363109 A1* 11/2023 Gupta ................ H05K 7/20272

* cited by examiner

SYSTEM AND METHOD FOR COOLING ELECTRONIC COMPUTING DEVICE WITH MULTIPLE-FUNCTION PUMP

RELATED APPLICATIONS

This application claims priority to and the benefit of U.S. Provisional Application No. 63/386,972, filed on Dec. 12, 2022, which is incorporated herein by reference in its entirety.

FIELD OF THE INVENTION

The present invention relates generally to liquid cooling for a coolant distribution unit, and more specifically, to a pump system for filling and recycling coolant.

BACKGROUND OF THE INVENTION

Many computing systems, and especially server systems, include heat-generating electronic devices, such as chipsets, that require liquid cooling for proper and efficient working condition. Typically, some present cooling configurations include multiple hot swappable pump modules in a coolant distribution unit that circulates coolant in a server system. While swapping the pump modules for maintenance or other service-related reasons, a pan collects the coolant and a pipe discharges the coolant out to the pump module when it is replaced. However, one problem with present cooling configurations is that they fail to take in account loss of cooling during exchange of the pump modules, as well as the time and financial resources wasted to achieve the exchange as diminished cooling means that server systems cannot function at full capability. Another problem of present cooling configurations is caused by reduction of the volume of coolant available, for example due to evaporation, in the coolant distribution unit. Yet another problem of the present cooling configuration is that they require separate pumps to achieve both recycling and filing of the coolant into the system. The present disclosure provides a solution for these and other cooling problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cooling distribution system is directed to cooling an electronic computing device. The cooling distribution system includes a distribution unit chassis, and a plurality of hot-swappable pump modules mounted within the distribution unit chassis for cooling an external electronic computing device. The plurality of hot-swappable pump modules is configured to circulate a coolant along a main cooling path. The cooling distribution system further includes a coolant inlet manifold mounted within the distribution unit chassis and fluidly coupled to the plurality of hot-swappable pump modules. The coolant inlet manifold allows entry of the coolant into the main cooling path. The cooling distribution system further includes a coolant collection pan for collecting leaked coolant from the coolant circulating along the main cooling path. The cooling distribution system further includes a recycle pump fluidly coupled to form a recycle cooling path between the coolant collection pan and the coolant inlet manifold. The recycle pump is configured to pump the leaked coolant from the coolant collection pan back to the coolant inlet manifold. The leaked coolant is recirculated into the main cooling path.

According to another aspect of the cooling distribution system described above, a coolant-level sensor is positioned to sense presence of the leaked coolant collected in the coolant collection pan.

According to another aspect of the cooling distribution system described above, the recycle pump begins to pump the leaked coolant in response to the coolant-level sensor sensing the presence of the leaked coolant in the coolant collection pan.

According to another aspect of the cooling distribution system described above, the recycle pump is fluidly coupled to the coolant collection pan via a coolant recycle conduit.

According to another aspect of the cooling distribution system described above, the coolant recycle conduit is selected from a group consisting of a hose, a pipe, or other fluid communication channel.

According to another aspect of the cooling distribution system described above, the recycle pump is fluidly coupled to the coolant collection pan directly via the coolant recycle conduit.

According to another aspect of the cooling distribution system described above, a multi-input valve is fluidly coupled to the recycle pump. The multi-input valve includes a first input for receiving the leaked coolant from the coolant collection pan. The multi-input valve further includes a second input for receiving a new supply of coolant.

According to another aspect of the cooling distribution system described above, the multi-input valve is a three-way valve. The first input is directly coupled with a first end of a coolant recycle conduit. The coolant recycle conduit has a second end that is in direct fluid communication with the coolant collection pan. The second input is directly coupled with a first end of a coolant supply conduit. The coolant supply conduit has a second end configured for attachment to an external coolant supply source.

According to another aspect of the cooling distribution system described above, the multi-input valve has a default position in which the first input receives and recycles the leaked coolant from the coolant collection pan back to the coolant inlet manifold.

According to another aspect of the cooling distribution system described above, the leaked coolant occurs when one or more of the plurality of hot-swappable pump modules are removed from the chassis.

According to other aspects of the present disclosure, a method is directed to cooling an electronic computing device with a cooling distribution system. The method includes providing a main cooling path along a plurality of hot-swappable pump modules that are mounted within a distribution unit chassis. The main cooling path is configured to cool an electronic computing device external to the distribution unit chassis. The method also includes introducing a coolant in the main cooling path via a coolant inlet manifold that is mounted within the distribution unit chassis. The method further includes collecting in a coolant collection pan leaked coolant from the main cooling path, and sensing presence of the leaked coolant in the coolant collection pan. The method further includes triggering pumping, via a recycle cooling path, of the leaked coolant from the coolant collection pan back to the coolant inlet manifold. The recycle cooling path includes a recycle pump fluidly coupled between the coolant collection pan and the coolant inlet manifold.

According to another aspect of the method described above, the method further includes adding a new coolant into the main cooling path via the recycle pump.

According to another aspect of the method described above, the method further includes supplying the new coolant into a multi-input valve that is fluidly coupled to the recycle pump.

According to another aspect of the method described above, the method further includes changing the recycle pump between a recycle mode and a supply mode.

According to another aspect of the method described above, in the recycle mode the recycle pump receives and recirculates the leaked coolant back into the main cooling path, and wherein in the supply mode the recycle pump receives and circulates new coolant into the main cooling path.

According to yet other aspects of the present disclosure, a cooling distribution system for a computing device includes a distribution unit chassis, and one or more hot-swappable pump modules that mounted at least in part within the distribution unit chassis for cooling electronic components. The one or more hot-swappable pump modules are configured to circulate a coolant along a main cooling path. The cooling distribution system further includes one or more hot-swappable filter modules that are mounted at least in part within the distribution unit chassis and are fluidly coupled along the main cooling path. The cooling distribution system further includes a system coolant inlet that is mounted at least in part within the distribution unit chassis. The system coolant inlet is fluidly coupled with the main cooling path to supply a new coolant along an inlet cooling path. The system coolant inlet is configured to receive the new coolant from an external coolant supply source. The cooling distribution system further includes a system coolant outlet that is mounted at least in part within the distribution unit chassis. The system coolant outlet is fluidly coupled with the main cooling path to remove coolant. The cooling distribution system further includes a coolant inlet manifold that is mounted within the distribution unit chassis and is fluidly coupled to the main cooling path. The cooling distribution system further includes a coolant collection pan for collecting leaked coolant from the coolant, which circulates along the main cooling path. The cooling distribution system further includes a recycle pump that is configured to change between a recycle mode and a supply mode. In the recycle mode, the recycle pump is fluidly coupled to form a recycle cooling path between the coolant collection pan and the coolant inlet manifold, the recycle pump pumping the leaked coolant from the coolant collection pan back to the coolant inlet manifold. In the supply mode, the recycle pump is fluidly coupled to form a supply cooling path between the recycle pump and the coolant inlet manifold, the recycle pump pumping the new coolant from the external coolant supply source. The supply cooling path is additional to the inlet cooling path.

According to another aspect of the cooling distribution system described above, a coolant-level sensor is positioned to sense presence of the leaked coolant collected in the coolant collection pan.

According to another aspect of the cooling distribution system described above, the coolant-level sensor triggers the recycle pump to pump the leaked coolant.

According to another aspect of the cooling distribution system described above, a multi-input valve is fluidly coupled to the recycle pump. The multi-input valve includes a first input for receiving the leaked coolant from the coolant collection pan, and a second input for receiving the new coolant from the external coolant supply source.

According to another aspect of the cooling distribution system described above, the multi-input valve is a three-way valve in which a default position is set to achieve the recycle mode.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
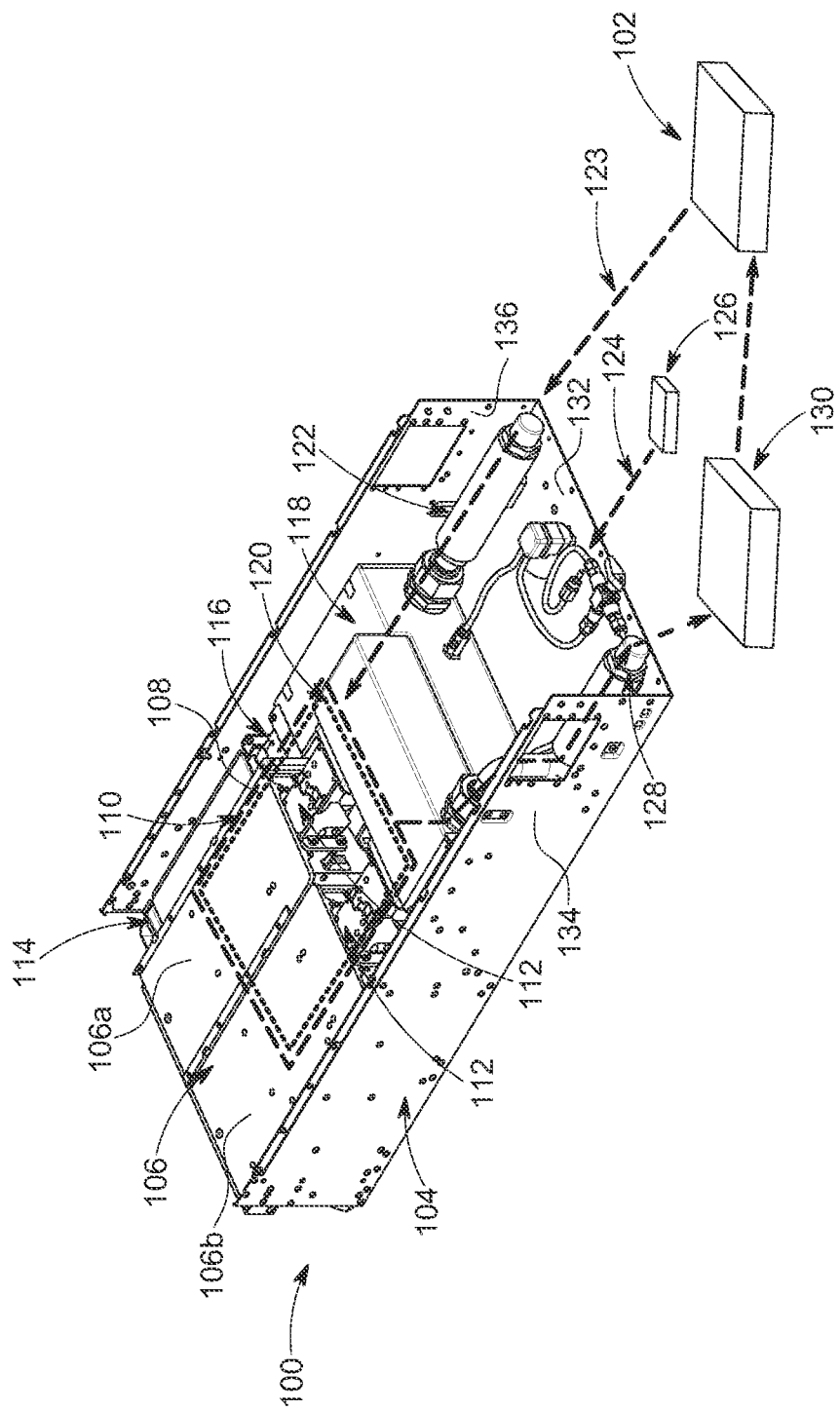
FIG. 1 is a perspective view illustrating a cooling distribution system.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a cooling distribution system 100 is directed to cooling one or more electronic computing devices 102, such as a server, a chipset, or other heat-generating electronic components. The electronic computing device 102 is a component that is external to the cooling distribution system 100. The electronic computing device 102 is physically coupled, such as being directly or indirectly mounted, to the cooling distribution system 100.

The cooling distribution system 100 includes a distribution unit chassis 104 in which a plurality of hot-swappable pump modules 106 are mounted for cooling the external electronic computing device 102. The hot-swappable pump modules 106 include, for example, a first pump module 106a and a second pump module 106b. The pump modules 106 are configured to circulate a coolant 108 along a main cooling path 110.

The hot-swappable pump modules 106 are configured to be removed and/or inserted while the cooling distribution system 100 is operating, without any need to shut down the cooling distribution system 100. For example, the hot-swappable pump modules 106 are configured with pump quick connectors 112 that help achieve the quick and easy removal and/or insertion of the hot-swappable pump modules 106. As such, the hot-swappable feature of the cooling distribution cooling system 100 allows continuous cooling even when one or more of the hot-swappable pump modules 106 are temporarily removed.

The cooling distribution system 100 further includes a filter module 114 configured with filter quick connectors 116 and mounted within the distribution unit chassis 104. The filter module 114 is included in the main cooling path 110, and is intended to keep out (or filter) unwanted particles in the coolant 108. The filter quick connectors 116 help achieve quick and easy removal and/or insertion of the filter module 114, which is optionally hot-swappable like the hot-swappable pump modules 106.

The cooling distribution system 100 further includes a coolant inlet manifold 118 and a coolant outlet manifold 120 mounted within the distribution unit chassis 104. The coolant inlet manifold 118 and the coolant outlet manifold 120 are fluidly coupled to the hot-swappable pump modules 106. The coolant inlet manifold 118 allows entry of the coolant 108 into the main cooling path 110. The coolant inlet manifold 118 is fluidly coupled with a system coolant inlet 122 via which it receives a cycled coolant 123 from the electronic computing device 102. The coolant outlet manifold 120 is configured to allow flow of some or all of the coolant 108 from the main cooling path 110 towards a heat exchanger 130. The coolant outlet manifold 120 is fluidly coupled with a system coolant outlet 128 via which coolant 108 flows from the cooling distribution system 100 to the heat exchanger 130. The heat exchanger 130, in turn, is configured to distribute the coolant 108 to the electronic computing device 102, from which the cycled coolant 123 flows back to the system coolant inlet 122.

The distribution unit chassis 104 includes a bottom plate 132, a left side wall 134, and a right side wall 136. The left side wall 134 extends perpendicularly from a first lateral end of the bottom plate 132. The right side wall 136 extends perpendicularly from a second lateral end of the bottom plate 132 that is opposite to the first lateral end. The distribution unit chassis 104 provides structural integrity and support to the components mounted at least partially within, such as the hot-swappable pump modules 106 and the coolant inlet manifold 118. The system coolant inlet and outlet 122, 128 are mounted within the distribution unit chassis 104 near a front longitudinal end. The coolant inlet and outlet manifolds 118, 120 are mounted near a rear end of the system coolant inlet and outlet 122, 128, before the mounted position of the hot-swappable pump modules 106.

Figure 2:
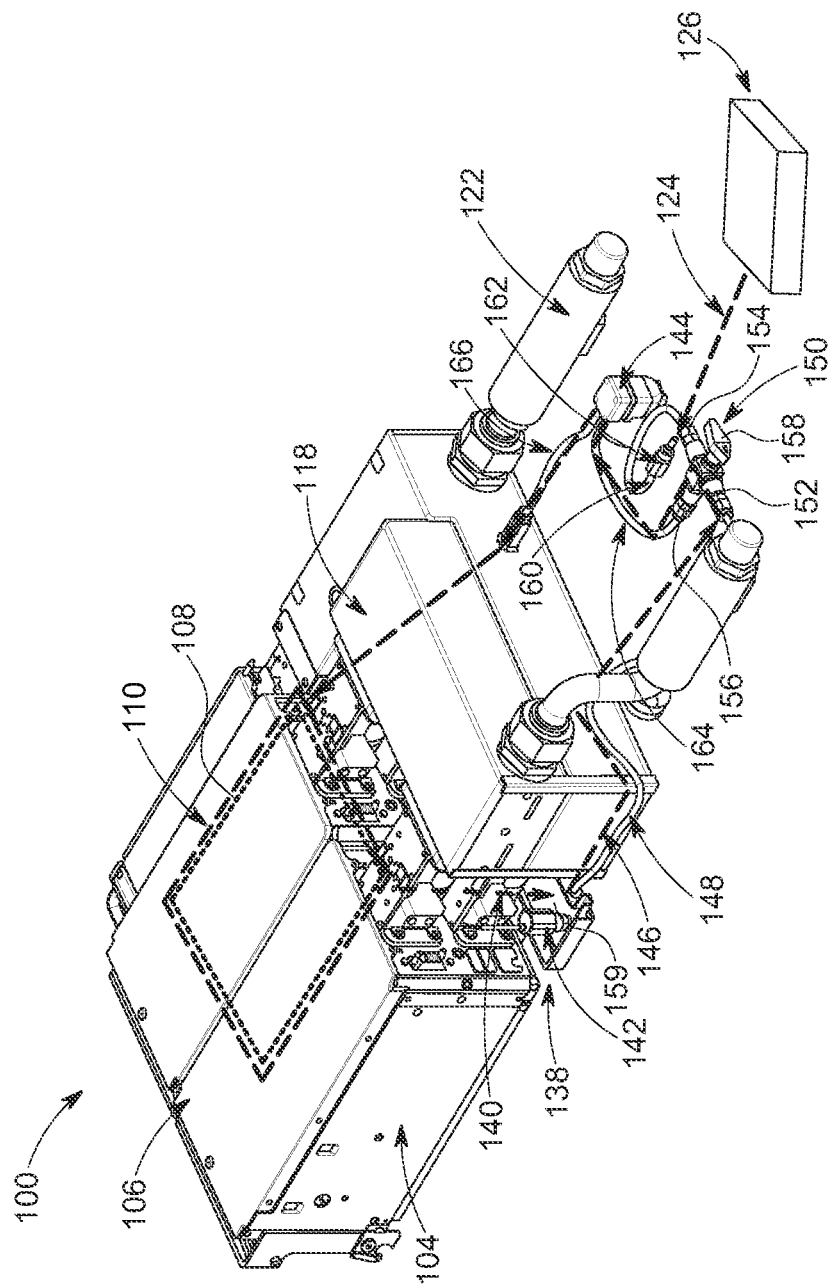
FIG. 2 is a perspective view illustrating other components of the cooling distribution system of FIG. 1.

Referring to FIG. 2, the cooling distribution system 100 further includes a coolant collection pan 138, which collects leaked coolant 140 from the coolant 108 circulating along the main cooling path 110. The coolant collection pan 138 is located between the hot-swappable pump modules 106 and the coolant inlet and outlet manifolds 118, 120. The leaked coolant 140 occurs, for example, when one or more of the hot-swappable pump modules 106 are removed from or inserted into the distribution unit chassis 104.

The cooling distribution system 100 further includes a coolant-level sensor 142 that is positioned to sense presence of the leaked coolant 140 collected in the coolant collection pan 138. When the leaked coolant 140 drips, or is otherwise deposited (e.g., from an unconnected pump quick connector 112 during the removal of a hot-swappable pump module 106), into the coolant collection pan 138, the coolant-level sensor 142 detects and signals the presence of the leaked coolant 140.

The cooling distribution system 100 further includes a recycle pump 144 that is fluidly coupled to form a recycle cooling path 146 between the coolant collection pan 138 and the coolant inlet manifold 118. The recycle pump 144 is configured to pump the leaked coolant 140 from the coolant collection pan 138 back to the coolant inlet manifold 118. Thus, the leaked coolant 140 is recirculated into the main cooling path 110. For example, the recycle pump 144 begins to pump the leaked coolant 140 in response to the coolant-level sensor 142 sensing the presence of the leaked coolant 140 in the coolant collection pan 138.

The recycle pump 144 is fluidly coupled to the coolant collection pan 138 via a coolant recycle conduit 148. The coolant recycle conduit 148 is optionally in the form of a hose, a pipe, a tube, or any other fluid communication channel.

The fluid communication between the recycle pump 144 and the coolant collection pan 138 is direct or indirect. For example, in the above example (which is illustrated in FIG. 2), the recycle pump 144 is directly coupled with the coolant collection pan 138 via the coolant recycle conduit 148.

Alternatively, the recycle pump 144 is indirectly coupled with the coolant collection pan 138 via a multi-input valve 150, as described below (and illustrated in FIG. 2).

Figure 3:
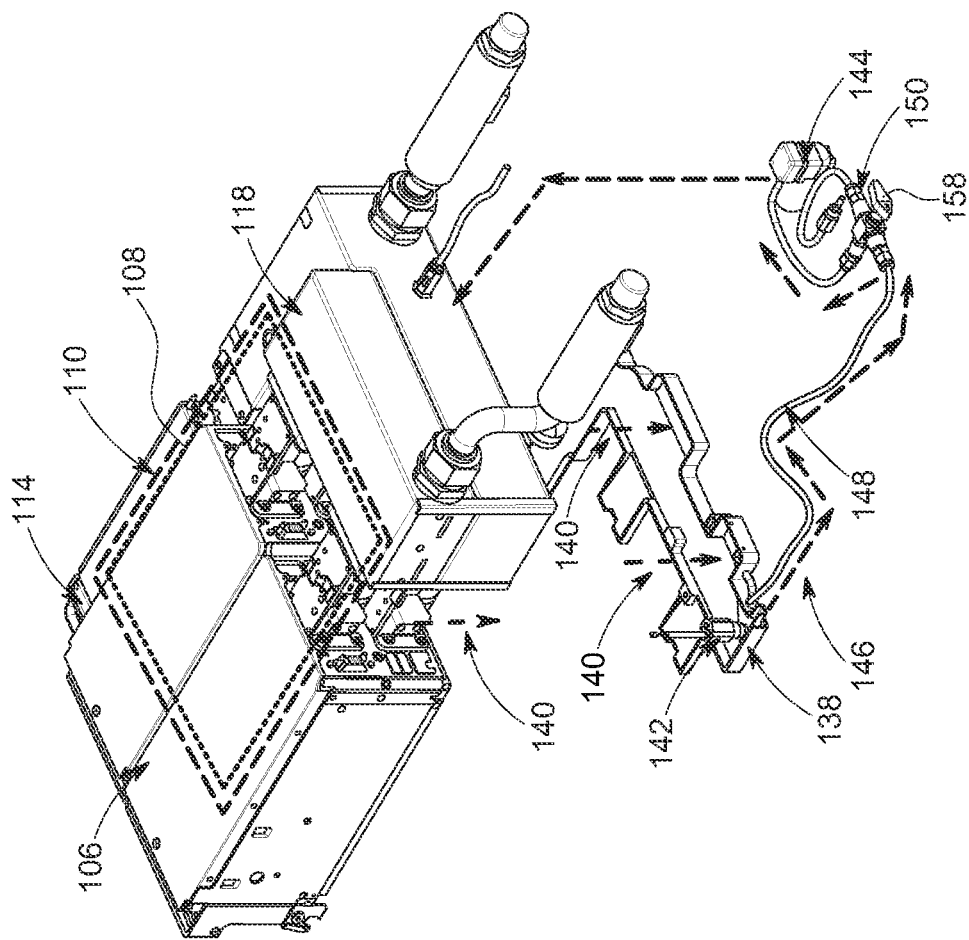
FIG. 3 is a perspective view illustrating a recycle mode of the cooling distribution system of FIG. 1.
Figure 4:
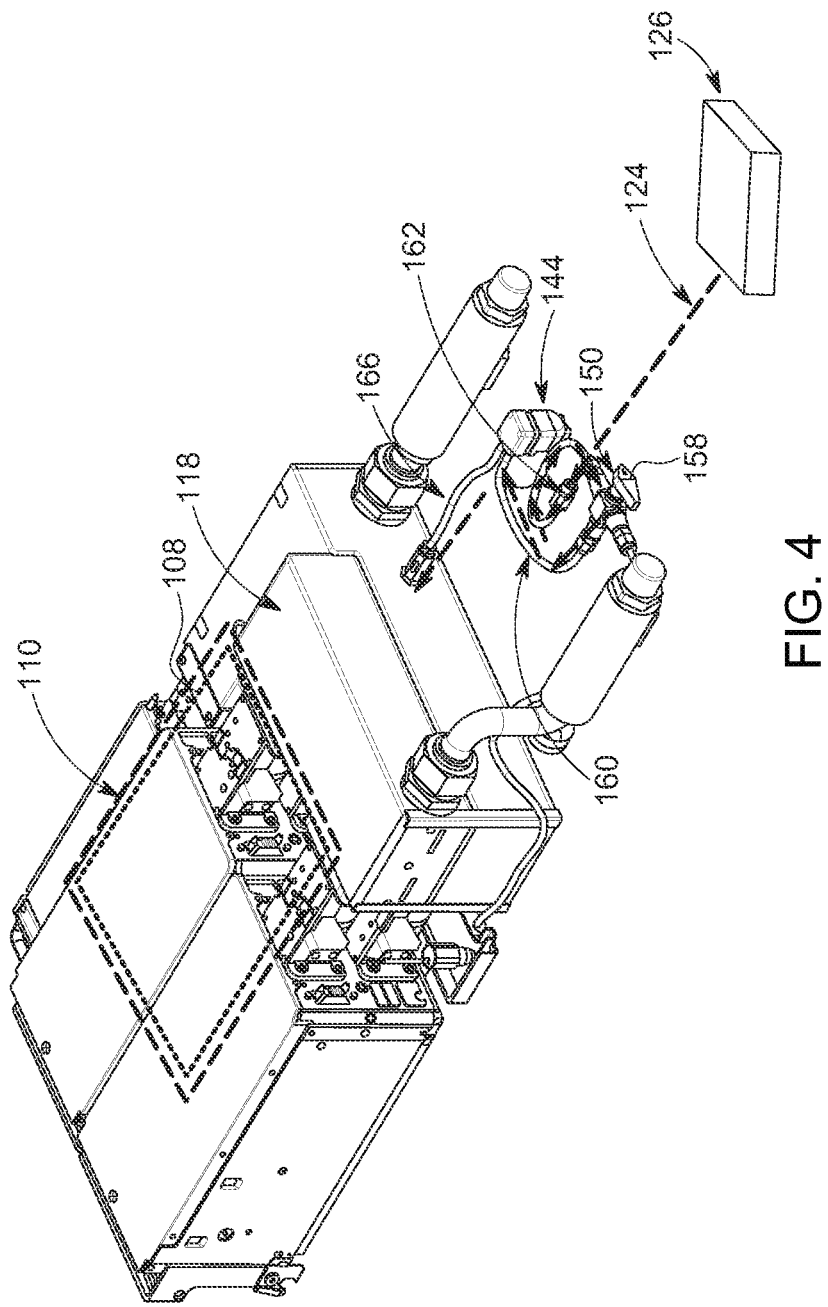
FIG. 4 is a perspective view illustrating a supply mode of the cooling distribution system of FIG. 1.

The multi-input valve 150 is further included in the cooling distribution system 100 for switching the recycle pump 144 between a plurality of modes, such as a recycle mode (illustrated in FIG. 3) or a supply mode (illustrated in FIG. 4). The multi-input valve 150 has one or more inputs and one or more outputs. For example, the multi-input valve 150 is in the form of a three-way ball valve that includes a first input 152, a second input 154, an output 156, and a switch lever 158.

By way of example, the first input 152 of the three-way valve 150 is fluidly coupled and configured to receive the leaked coolant 140 from the coolant collection pan 138, in the recycle mode of the recycle pump 144. Specifically, the first input 152 is directly coupled with an adjacent, first end of the coolant recycle conduit 148. A second end of the coolant recycle conduit 148 is in direct fluid communication with the coolant collection pan 138. For example, the second end of the coolant recycle conduit 148 is positioned directly into the coolant collection pan 138, such as in direct contact with a bottom surface 159 of the coolant collection pan 138.

The second input 154 of the three-way valve 150 is fluidly coupled and configured to receiving a new supply of coolant, such as a new coolant 124 from an external coolant supply source 126, in the supply mode of the recycle pump 144. Specifically, the second input 154 is directly coupled with a first end of a coolant supply conduit 160. The coolant supply conduit 160 optionally includes supply quick connectors 162 for quick and easy installation or removal of the coolant supply conduit 160 to or from the external coolant supply source 126.

The output 156 of the three-way valve 150 is fluidly coupled and configured to discharge either the leaked coolant 140 or the new coolant 124 into the recycle pump 144. Specifically, the output 156 is directly coupled with a first end of a pump inlet conduit 164. A second end of the pump inlet conduit 164 is directly coupled to the recycle pump 144. Thus, the leaked coolant 140 or the new coolant 124 is discharged to the recycle pump 144 via the pump inlet conduit 164.

The recycle pump 144 is further fluidly coupled to the coolant inlet manifold 118 via a pump outlet conduit 166. A first end of the pump outlet conduit 166 is directly attached to the recycle pump 144, while a second end of the pump outlet conduit 166 is directly attached to the coolant inlet manifold 118. Thus, the leaked coolant 140 or the new coolant 124 is discharged from the recycle pump 144 via the pump outlet conduit 166.

Optionally, any of the conduits are in the form of any type of fluid communication channels, such as a hose, a pipe, or a tube, similar to the coolant recycle conduits 148. Thus, any of the coolant supply conduit 160, the pump inlet conduit 164, or the pump outlet conduit 166 are selected from any of these exemplary forms.

The switch lever 158 is switchable between a plurality of positions that correspond to respective flow modes. For example, the plurality of positions include a default position (e.g., a left-horizontal position) that corresponds to the recycle mode of the recycle pump 144, and in which the leaked coolant 140 is recycled back to the coolant inlet manifold 118. When a new supply of coolant is required, the switch lever 158 is moved to a different position (e.g., a right-horizontal position) that corresponds to the supply mode of the recycle pump 144.

Referring to FIG. 3, the recycle mode of the recycle pump 144 is illustrated in more detail. The switch lever 158 of the three-way valve 150 is positioned in the default position (e.g., the right-horizontal position), which allows flow of the leaked coolant 140 along the recycle cooling path 146. When a user exchanges one of the hot-swappable pump modules 106 or the filter module 114, a loss in the coolant 108 occurs and drops into the coolant collection pan 138. The lost coolant accumulates in the form of the leaked coolant 140 in the coolant collection pan 138, and, in response, the coolant-level sensor 142 detects the presence of the leaked coolant 140. Upon the detection of the leaked coolant 140, the coolant-level sensor 142 triggers a signal in response to which the recycle pump 144 begins to draw the leaked coolant 140 via the coolant recycle conduit 148. The recycle pump 144 pumps the leaked coolant 140 into the coolant inlet manifold 118, thus, recirculating (or recycling) otherwise lost coolant back into the main cooling path 110.

Referring to FIG. 4, the supply mode of the recycle pump 144 is illustrated in more detail. The switch lever 158 of the three-way valve 150 is positioned in a secondary position (e.g., the left-horizontal position), which allows flow of the new coolant 124 from the external coolant supply source 126 to the main cooling path 110. The external coolant supply source 126 is fluidly coupled with the quick connectors 162 of the coolant supply conduit 160. The recycle pump 144 is activated to draw the new coolant 124 via the coolant supply conduit 160, from the external coolant supply source 126, and pump the new coolant 124 back into the main cooling path 110 through the coolant inlet manifold 118. Thus, if needed, the coolant 108 is replenished with the new coolant 124 if the leaked coolant 140 is insufficient. More specifically, the recycle pump 144 draws in the new coolant 124 via the coolant supply conduit 160, and pumps it to the coolant inlet manifold 118 via the pump outlet conduit 166. The supply mode may be activated, for example, when coolant levels drop below a threshold level, thus, ensuring sufficient coolant is circulated within the main cooling path 110.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling distribution system for an electronic computing device, the cooling distribution system comprising:
   a distribution unit chassis;
   a plurality of hot-swappable pump modules mounted within the distribution unit chassis for cooling an external electronic computing device, the plurality of hot-swappable pump modules being configured to circulate a coolant along a main cooling path;
a coolant inlet manifold mounted within the distribution unit chassis and fluidly coupled to the plurality of hot-swappable pump modules, the coolant inlet manifold allowing entry of the coolant into the main cooling path;
a coolant collection pan for collecting leaked coolant from the coolant circulating along the main cooling path;
a recycle pump fluidly coupled to form a recycle cooling path between the coolant collection pan and the coolant inlet manifold, the recycle pump being configured to pump the leaked coolant from the coolant collection pan back to the coolant inlet manifold, the leaked coolant being recirculated into the main cooling path; and
a multi-input valve fluidly coupled to the recycle pump, the multi-input valve including a first input for receiving the leaked coolant from the coolant collection pan, the multi-input valve further including a second input for receiving a new supply of coolant.

2. The cooling distribution system of claim 1, further comprising a coolant-level sensor positioned to sense presence of the leaked coolant collected in the coolant collection pan.

3. The cooling distribution system of claim 2, wherein the recycle pump begins to pump the leaked coolant in response to the coolant-level sensor sensing the presence of the leaked coolant in the coolant collection pan.

4. The cooling distribution system of claim 1, wherein the recycle pump is fluidly coupled to the coolant collection pan via a coolant recycle conduit.

5. The cooling distribution system of claim 4, wherein the coolant recycle conduit is selected from a group consisting of a hose, a pipe, or other fluid communication channel.

6. The cooling distribution system of claim 4, wherein the recycle pump is fluidly coupled to the coolant collection pan directly via the coolant recycle conduit.

7. The cooling distribution system of claim 1, wherein the multi-input valve is a three-way valve, the first input being directly coupled with a first end of a coolant recycle conduit, the coolant recycle conduit having a second end that is in direct fluid communication with the coolant collection pan, the second input being directly coupled with a first end of a coolant supply conduit, the coolant supply conduit having a second end configured for attachment to an external coolant supply source.

8. The cooling distribution system of claim 1, wherein the multi-input valve has a default position in which the first input receives and recycles the leaked coolant from the coolant collection pan back to the coolant inlet manifold.

9. The cooling distribution system of claim 1, wherein the leaked coolant occurs when one or more of the plurality of hot-swappable pump modules are removed from the chassis.

10. A method for cooling an electronic computing device with a cooling distribution system, the method comprising:
providing a main cooling path along a plurality of hot-swappable pump modules mounted within a distribution unit chassis, the main cooling path being configured to cool an electronic computing device external to the distribution unit chassis;
introducing a coolant in the main cooling path via a coolant inlet manifold that is mounted within the distribution unit chassis;
collecting in a coolant collection pan leaked coolant from the main cooling path;
sensing presence of the leaked coolant in the coolant collection pan;
triggering pumping, via a recycle cooling path, of the leaked coolant from the coolant collection pan back to the coolant inlet manifold, the recycle cooling path including a recycle pump fluidly coupled between the coolant collection pan and the coolant inlet manifold; and
adding a new coolant into the main cooling path via the recycle pump.

11. The method of claim 10, further comprising supplying the new coolant into a multi-input valve that is fluidly coupled to the recycle pump.

12. The method of claim 10, further comprising changing the recycle pump between a recycle mode and a supply mode.

13. The method of claim 12, wherein in the recycle mode the recycle pump receives and recirculates the leaked coolant back into the main cooling path, and wherein in the supply mode the recycle pump receives and circulates new coolant into the main cooling path.

14. A cooling distribution system for a computing device, the cooling distribution system comprising:
a distribution unit chassis;
one or more hot-swappable pump modules mounted at least in part within the distribution unit chassis for cooling electronic components, the one or more hot-swappable pump modules being configured to circulate a coolant along a main cooling path;
one or more hot-swappable filter modules mounted at least in part within the distribution unit chassis and fluidly coupled along the main cooling path;
a system coolant inlet mounted at least in part within the distribution unit chassis, the system coolant inlet being fluidly coupled with the main cooling path to supply a new coolant along an inlet cooling path, the system coolant inlet being configured to receive the new coolant from an external coolant supply source;
a system coolant outlet mounted at least in part within the distribution unit chassis, the system coolant outlet being fluidly coupled with the main cooling path to remove coolant;
a coolant inlet manifold mounted within the distribution unit chassis and fluidly coupled to the main cooling path;
a coolant collection pan for collecting leaked coolant from the coolant circulating along the main cooling path; and
a recycle pump configured to change between a recycle mode in which the recycle pump is fluidly coupled to form a recycle cooling path between the coolant collection pan and the coolant inlet manifold, the recycle pump pumping the leaked coolant from the coolant collection pan back to the coolant inlet manifold, and
a supply mode in which the recycle pump is fluidly coupled to form a supply cooling path between the recycle pump and the coolant inlet manifold, the recycle pump pumping the new coolant from the external coolant supply source, the supply cooling path being additional to the inlet cooling path.

15. The cooling distribution system of claim 14, further comprising a coolant-level sensor positioned to sense presence of the leaked coolant collected in the coolant collection pan.

16. The cooling distribution system of claim 15, wherein the coolant-level sensor triggers the recycle pump to pump the leaked coolant.

17. The cooling distribution system of claim 14, further comprising a multi-input valve fluidly coupled to the recycle pump, the multi-input valve including a first input for receiving the leaked coolant from the coolant collection pan, the multi-input valve further including a second input for receiving the new coolant from the external coolant supply source.

18. The cooling distribution system of claim 17, wherein the multi-input valve is a three-way valve in which a default position is set to achieve the recycle mode.

19. A method for cooling an electronic computing device with a cooling distribution system, the method comprising:

providing a main cooling path along a plurality of hot-swappable pump modules mounted within a distribution unit chassis, the main cooling path being configured to cool an electronic computing device external to the distribution unit chassis;

introducing a coolant in the main cooling path via a coolant inlet manifold that is mounted within the distribution unit chassis;

collecting in a coolant collection pan leaked coolant from the main cooling path;

sensing presence of the leaked coolant in the coolant collection pan;

triggering pumping, via a recycle cooling path, of the leaked coolant from the coolant collection pan back to the coolant inlet manifold, the recycle cooling path including a recycle pump fluidly coupled between the coolant collection pan and the coolant inlet manifold; and changing the recycle pump between a recycle mode and a supply mode.

20. The method of claim 19, wherein in the recycle mode the recycle pump receives and recirculates the leaked coolant back into the main cooling path, and wherein in the supply mode the recycle pump receives and circulates new coolant into the main cooling path.

* * * * *